(12) United States Patent
Fujii (10) Patent No.: US 6,914,308 B2
(45) Date of Patent: Jul. 5, 2005

(54) VERTICAL PNP BIPOLAR TRANSISTOR

(75) Inventor: Hidenori Fujii, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 425 days.

(21) Appl. No.: 10/032,547

(22) Filed: Jan. 2, 2002

(65) Prior Publication Data

US 2003/0001234 A1 Jan. 2, 2003

(30) Foreign Application Priority Data

Jul. 2, 2001 (JP) ........................................ 2001-200423

(51) Int. Cl.[7] .............................................. H01L 29/76
(52) U.S. Cl. ...................... 257/378; 257/526; 257/565; 438/202; 438/207; 438/322
(58) Field of Search ................. 257/378, 526, 257/565; 438/202, 207, 322

(56) References Cited

U.S. PATENT DOCUMENTS 5,364,802 A * 11/1994 Kataoka et al. ............. 438/363

2001/0012655 A1 * 8/2001 Nordstom et al. .......... 438/239

FOREIGN PATENT DOCUMENTS

JP          6-349850          12/1994

* cited by examiner

Primary Examiner—Van Thu Nguyen
Assistant Examiner—Christian D. Wilson
(74) Attorney, Agent, or Firm—McDermott, Will & Emery (57) ABSTRACT

A semiconductor device in which a vertical pnp-bipolar transistor is formed in a prescribed element region on a semiconductor substrate includes: a buried $n^+$-layer of a high concentration formed in the prescribed element region; and a p-type collector layer formed on the buried $n^+$-layer. By introducing impurities that has a larger diffusion coefficient than the buried $n^+$-layer, the collector layer can be formed on the buried $n^+$-layer formed in common with other element regions, without any special masking.

8 Claims, 8 Drawing Sheets

Fig. 1

NPN   NMOS   PMOS   Sub   V-PNP   L-PNP

PRIOR ART

*Fig. 6B*

PRIOR ART

*Fig. 6C*

PRIOR ART

*Fig. 6D*

PRIOR ART

Fig. 7D PRIOR ART

VERTICAL PNP BIPOLAR TRANSISTOR

BACKGROUND OF THE INVENTION

1. Field of the Invention

The present invention relates to a semiconductor device, and a method of manufacturing the same, and more specifically to a semiconductor device comprising a vertical pnp (V-PNP) bipolar transistor, and a method of manufacturing such a semiconductor device.

2. Background Art

Recent semiconductor integrated circuits, for example, bipolar integrated circuits have a structure wherein both npn-bipolar transistors and vertical pnp-bipolar transistors are packaged together. Also as represented by a BiCMOS, various elements, such as npn-bipolar transistors, MOS transistors, and pnp-bipolar transistors may be packaged together on the same substrate to constitute one chip.

FIGS. 6 to 8 are schematic sectional views for illustrating the sequence of process steps of a method of manufacturing a conventional bipolar integrated circuit wherein an npn-bipolar transistor (NPN), an lateral pnp-bipolar transistor (L-PNP), and a vertical pnp-bipolar transistor (V-PNP) are packaged together. The configuration and manufacturing method of a conventional bipolar integrated circuit will be described below referring to FIGS. 6 to 8.

Figure 6A:
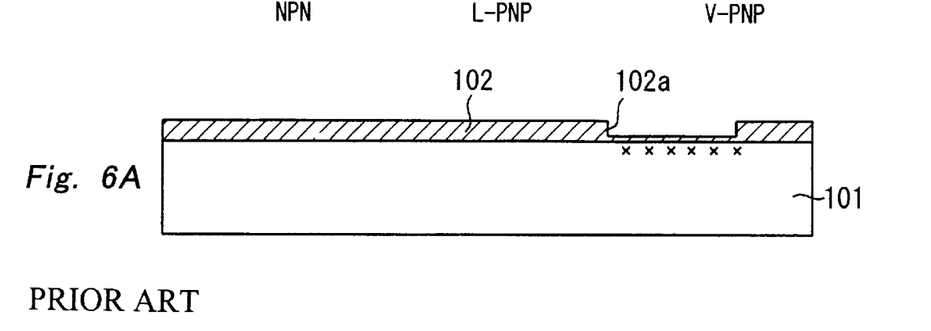
FIGS. 6A to 6D are schematic sectional views sequentially showing the process steps of manufacturing a conventional semiconductor device.

First, as shown in FIG. 6A, a silicon oxide film 102 of a thickness of about 6000 angstrom is formed on a p-type silicon semiconductor substrate 101, and an opening 102a is formed in the silicon oxide film 102 by photolithography followed by dry etching. Then, phosphorus (P) ions are implanted into the substrate 101 using the silicon oxide film 102 as a mask under the condition of an acceleration energy of 120 keV, and a dose of $5 \times 10^{14}/cm^2$, and the substrate 101 is subjected to heat treatment at a temperature of 1200° C. for 30 minutes. Thereby, a buried n⁻-type layer 103 is formed on the area where in V-PNP is to be formed.

Figure 6B:
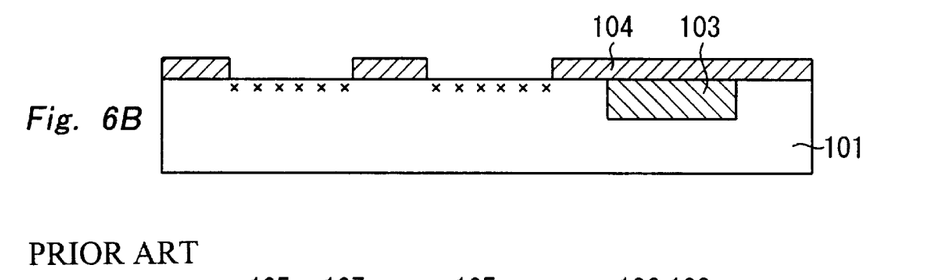

Next, as shown in FIG. 6B, after the silicon oxide film 102 is removed, a silicon oxide film 104 of a thickness of about 6000 angstrom is formed on the surface of the p-type silicon semiconductor substrate 101, and an opening is formed in the silicon oxide film 104 by photolithography followed by dry etching. Then, antimony (Sb) ions are implanted into the substrate 101 using the silicon oxide film 104 as a mask under the condition of an acceleration energy of 50 keV, and a dose of $4 \times 10^{15}/cm^2$, and the substrate 101 is subjected to heat treatment at a temperature of 1200° C. for 2 hours. Thereby, a buried n⁺-type layer 105 is formed on the area where an NPN and an L-PNP are to be formed.

Figure 6C:
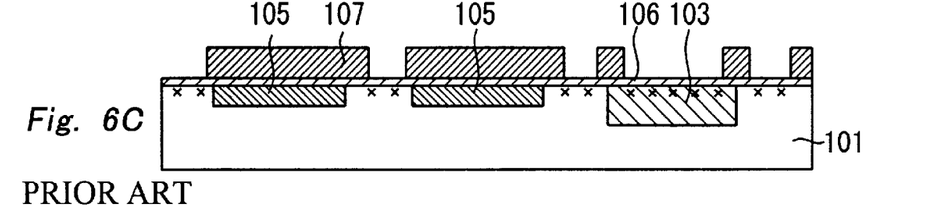

Next, as shown in FIG. 6C, after the silicon oxide film 104 is removed, an underlying oxide film 106 of a thickness of about 1000 angstrom is formed, and a resist film 107 having a prescribed opening is formed by photolithography. Then, boron (B) ions are implanted into the substrate 101 using the resist film 107 as a mask under the condition of an acceleration energy of 50 keV, and a dose of $4 \times 10^{14}/cm^2$, and the substrate 101 is subjected to heat treatment at a temperature of 1000° C. for 30 minutes. Thereby, a lower isolation layer 119 for isolating NPN, L-PNP, and V-PNP regions from each other. In the region to form the V-PNP, a collector layer 120 consisting of the same layer as the lower isolation layer 119 is formed on the buried n⁻-type layer 103.

Figure 6D:
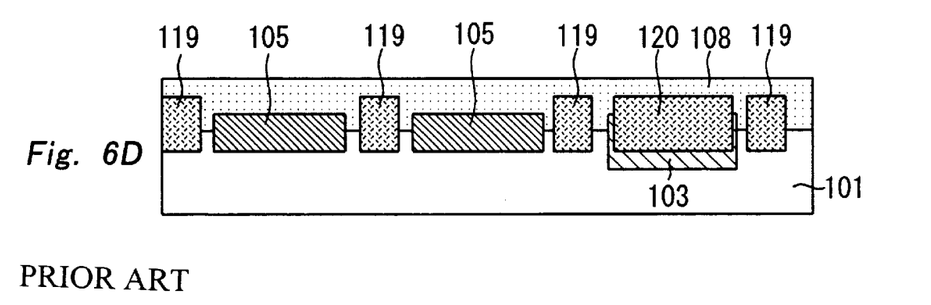

Next, as shown in FIG. 6D, after the resist film 107 and the underlying oxide film 106 are removed, epitaxial growth is performed. Thereby, an epitaxial layer 108 of a thickness of about 4 μm, and a resistivity of about 3 Ω·cm is formed on the p-type silicon semiconductor substrate 101.

Figure 7A:
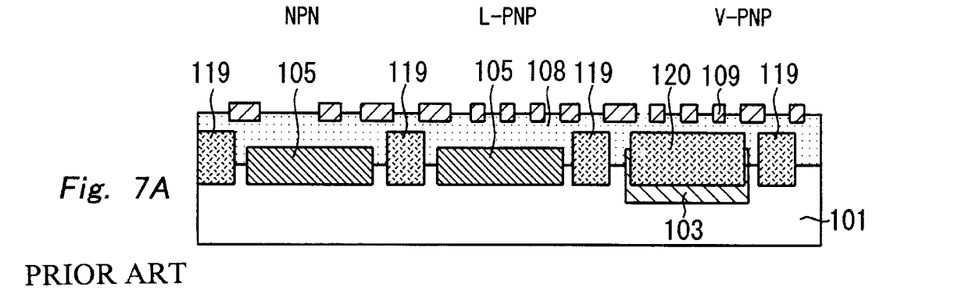
FIGS. 7A to 7D are schematic sectional views sequentially showing the process steps of manufacturing the conventional semiconductor device.

Next, as shown in FIG. 7A, after a silicon nitride film (not shown) of a thickness of about 1000 angstrom is formed and patterned by photolithography followed by dry etching, the substrate 101 is subjected to heat treatment at a temperature of about 950° C. for about 3 hours to form a field oxide film 109 of a thickness of about 15000 angstrom on the epitaxial layer 108.

Figure 7B:
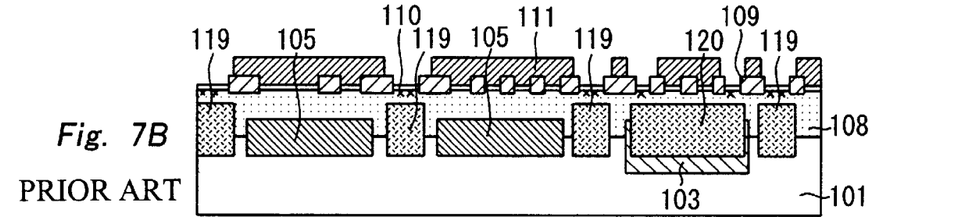

Next, as shown in FIG. 7B, an underlying oxide film 110 of a thickness of about 500 angstrom is formed on the epitaxial layer 108, and a resist film 111 having a prescribed opening is formed by photolithography. Thereafter, boron (B) ions are implanted using the resist film 111 as a mask under the condition of an acceleration energy of 50 keV, and a dose of $4 \times 10^{14}/cm^2$, and the substrate 101 is subjected to heat treatment at a temperature of 1000° C. for 30 minutes. Thereby, an upper isolation layer 121 connected to the lower isolation layer 119, and for isolating NPN, L-PNP, and V-PNP regions from each other together with the lower isolation layer 119, is formed. Also in the region to form the V-PNP, a collector contact layer 122 consisting of the same layer as the upper isolation layer 121 is formed, and connected to the collector layer 120.

In this step, instead of implanting boron ions, a boron-silicate glass (BSG) film may be deposited on the regions where these p-type diffused layers are to be formed, and subjected to heat treatment at about 800 to 1000° C., to diffuse boron in the boron-silicate glass into the epitaxial layer 108.

Figure 7C:
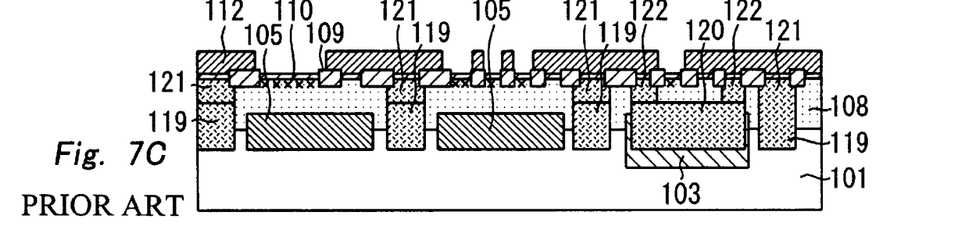

Next, as shown in FIG. 7C, after the resist film 111 is removed, a resist film 112 having a prescribed opening is formed by photolithography. Thereafter, boron ions are implanted using the resist film 112 as a mask under the condition of an acceleration energy of 50 keV, and a dose of $4 \times 10^{14}/cm^2$, and the substrate 101 is subjected to heat treatment at a temperature of 1000° C. for 15 minutes. Thereby, a base layer 124 is formed on the region to form the NPN, an emitter layer 123 is formed on the region to form the V-PNP, and a diffused layer 127 to be an emitter layer and a collector layer is formed on the region to form the L-PNP.

Figure 7D:
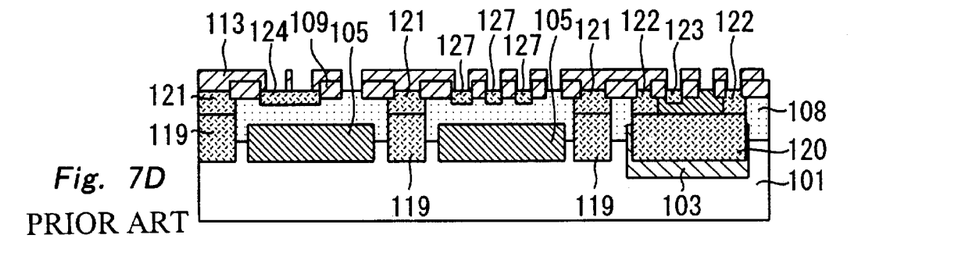

Next, as shown in FIG. 7D, after a silicon oxide film 113 is formed on the entire surface of the substrate 101, and the silicon oxide film 113 is selectively removed by photolithography followed by dry etching.

Figure 8A:
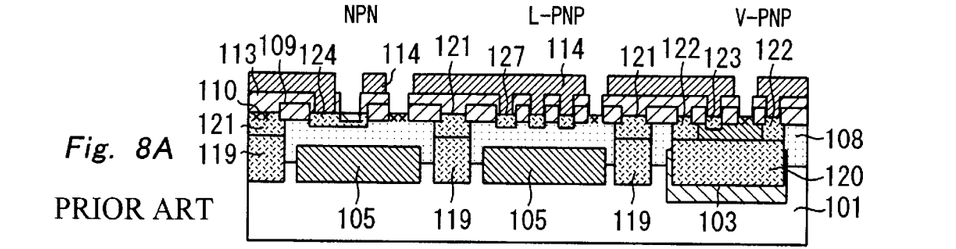
FIGS. 8A to 8D are schematic sectional views sequentially showing the process steps of manufacturing the conventional semiconductor device.

Next, as shown in FIG. 8A, a resist film 114 having a prescribed opening is formed by photolithography. Then, arsenic (As) ions are implanted using the resist film 114 as a mask under the condition of an acceleration energy of 50 keV, and a dose of $5 \times 10^{15}/cm^2$, and the substrate 101 is subjected to heat treatment at a temperature of 1000° C. for 20 minutes. Thereby, an emitter layer 125 is formed in the base layer 124 on the region to form the NPN, and a base-leader layer 126 connected to the epitaxial layer 108 as the base layer is formed on the region to form the V-PNP.

Figure 8B:
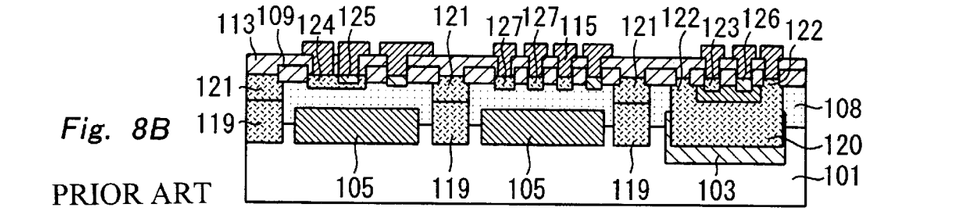

Next, as shown in FIG. 8B, an aluminum film 115 of a thickness of about 6500 angstrom to be a contact layer is formed, and an electrode consisting of the aluminum film 115 is formed by photolithography followed by dry etching.

Figure 8C:
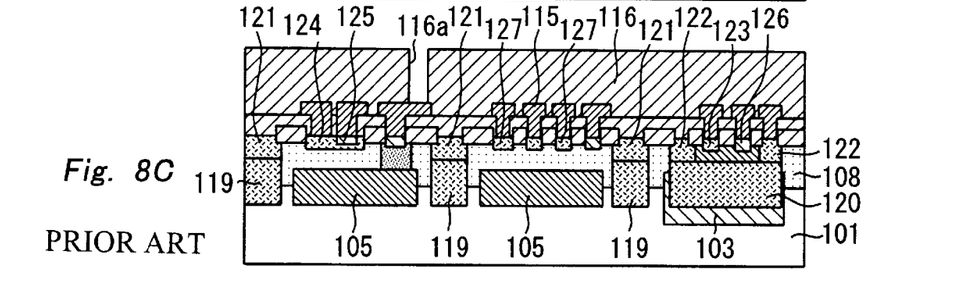

Next, as shown in FIG. 8C, an interlayer insulating film 116 which consists of silicon oxide film of a thickness of about 10000 angstrom is formed, and a through-hole 116a that reaches the electrode consisting of the aluminum film 115 is formed by photolithography followed by dry etching.

Figure 8D:
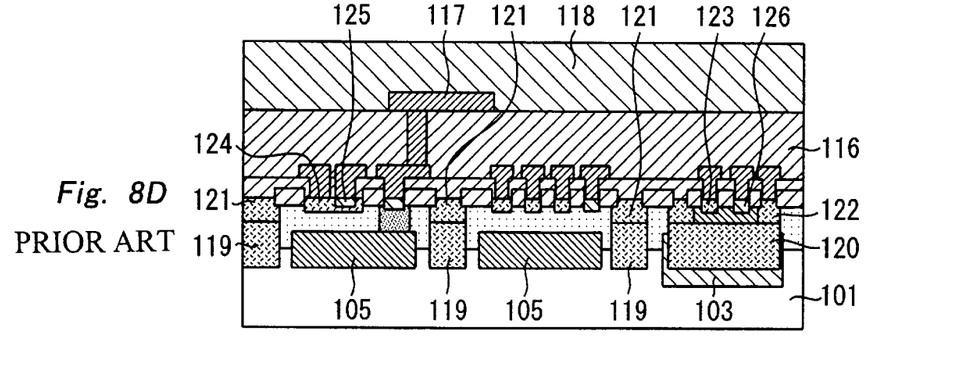

Then, an aluminum film 117 of a thickness of about 10000 angstrom is formed and patterned by photolithography followed by dry etching. Thereafter, a glass coating film 118 of a thickness of about 7500 angstrom is formed, and a prescribed opening is formed by photolithography followed by dry etching. Thereby, the structure of a bipolar integrated circuit as shown in FIG. 8D is obtained.

However, in a conventional semiconductor device as shown in FIGS. 6 to 8, a buried n⁻-layer 103 different from other regions must be formed in the region to form a vertical pnp-bipolar transistor on a p-type silicon semiconductor substrate 101.

Moreover, a buried N⁺-layer 105 must be formed in order to isolate the region other than the region to form the vertical pnp-bipolar transistor from the substrate potential, to use it as the collector layer of the npn-bipoler transistor, and to reduce the resistance of the collector layer. However, in the region to form the pnp-bipolar transistor, a p-type diffused layer, as the collector layer 120, cannot be formed directly on the buried N⁺-layer 105 formed to be same as other regions. The reason is that since the buried N⁺-layer 105 has a high concentration, the formation of the p-type diffused layer of the inverse conductivity type overlapping the buried N⁺-layer 105 is difficult. Therefore, as FIG. 6 shows, the collector layer 120 is formed after the deep buried n⁻-layer 103 of a low concentration is formed.

Although this buried n⁻-layer 103 has the function to isolate the collector layer 120 from the potential of the p-type silicon semiconductor substrate 101, process steps, such as the formation of the underlying silicon oxide film 102, photolithography followed by dry etching, the implantation of phosphorus ions, heat treatment, and the removal of the silicon oxide film 102, is essential for forming the buried n⁻-layer 103.

Therefore, problems of the complicated process steps, and increase in manufacturing costs arise. In addition, the buried n⁻-layer 103 must be aligned with the collector layer 120 at high accuracy, and dimensional margins of about 2 μm in the horizontal direction must be secured on the both side of the collector layer 120 to form the buried n⁻-layer 103. This is because the collector layer 120 cannot be isolated electrically from the p-type silicon semiconductor substrate 101, unless the buried n⁻-layer 103 is formed immediately under the collector layer 120. Therefore, increase in the area of the vertical pnp-bipolar transistor cannot be avoided.

In the conventional semiconductor devices, as described above, a buried n⁻-layer 103 different from other regions must be formed in the region to form a vertical pnp-bipolar transistor. This makes the process steps complicated, and results in increase in manufacturing costs. Also, since the buried n⁻-layer 103 must be accurately aligned to the collector layer 120, the region to form a vertical pnp-bipolar transistor is expanded in order to secure the dimensional margins.

SUMMARY OF THE INVENTION

Therefore, the object of the present invention is to solve the above-described problems, and to provide a semiconductor device comprising a vertical pnp-bipolar transistor that can isolate the collector layer from the substrate potential without requiring complicated process steps, lower the manufacturing costs, and achieve downsizing, and to provide a method of manufacturing such a semiconductor device.

According to one aspect of the present invention, a semiconductor device comprises a semiconductor substrate, an n-type buried layer of high concentration formed on the semiconductor substrate, a p-type diffused layer formed following the n-type buried layer on the n-type buried layer, and a pnp-bipolar transistor having the p-type diffused layer as a collector layer, formed on the semiconductor substrate.

According to another aspect of the present invention, a method of manufacturing a semiconductor device comprises the following steps. Firstly n-type impurities are introduced into a semiconductor substrate to form a first impurity-diffused layer. Secondly p-type impurities are introduced into a region where the first impurity-diffused layer has been formed. Thirdly an epitaxial layer is grown on the semiconductor substrate including an area on the first impurity-diffused layer to bury the first impurity-diffused layer. Fourthly the p-type impurities are diffused on the first impurity-diffused layer by heat treatment to form a second impurity-diffused layer containing the p-type impurities on the first impurity-diffused layer. Fifthly a pnp-bipolar transistor having the second impurity-diffused layer as a collector layer is formed on the first impurity-diffused layer.

According to the present invention, in a semiconductor device comprising a vertical pnp-bipolar transistor in a prescribed element region, by forming a p-type collector layer so as to adhere onto an n-type buried layer of a high concentration, the n-type buried layer can isolate the collector layer from the substrate potential. Also, by forming the p-type collector layer on the n-type buried layer, the p-type collector layer can be formed without special mask alignment, and the further downsizing of the device can be achieved.

Other and further objects, features and advantages of the invention will appear more fully from the following description.

DETAILED DESCRIPTION OF THE PREFERRED EMBODIMENTS

Figure 1:
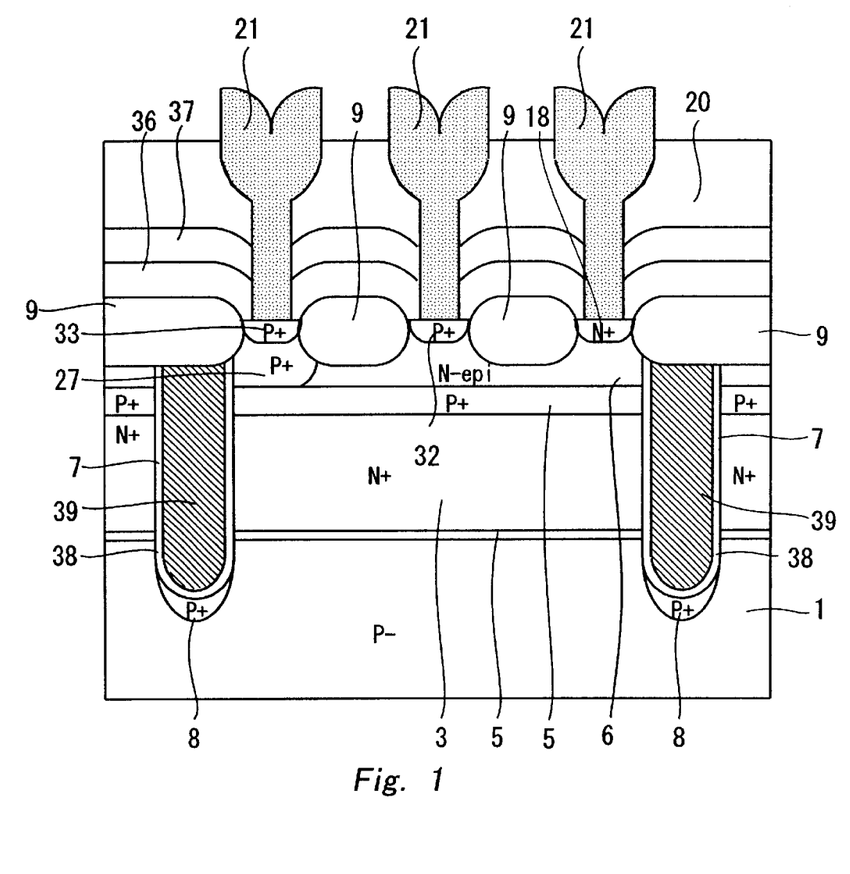
FIG. 1 is a schematic sectional view showing the configuration of a semiconductor device according to the embodiment of the present invention.

The embodiments of the present invention will be described below referring to the drawings. FIG. 1 is a schematic sectional view showing the configuration of a semiconductor device according to the embodiment of the present invention. In the semiconductor device according to the embodiment, an epitaxial layer 6 is formed on a buried n+-layer 3 on a p-type silicon semiconductor substrate 1, and a vertical pnp-bipolar transistor (V-PNP) is formed on the epitaxial layer 6 undergone element isolation into islands by a trench isolation structure consisting of trenches formed to left and right of the epitaxial layer 6, and the buried n+-layer 3.

A buried p+-layer 5 is formed on the n+-layer 3, and the epitaxial layer 6 is formed on the p+-layer 5 on the n+-layer 3. The p+-layer 5 acts as a collector layer of the V-PNP. A p-well 27 is formed as a collector-drawing portion on a part of the buried p+-layer 5, and a collector-leader layer 33 is formed on the surface region of the p-well 27.

A p-type emitter layer 32, and an n-type base-leader layer 18 are also formed on the surface region of the epitaxial layer 6. The epitaxial layer 6 between the emitter layer 32 and the buried p+-layer 5, which is the collector layer, has an n-type conductivity, and the epitaxial layer 6 acts as a base layer. The base-leader layer 18 has the function to supply the n-type epitaxial layer 6 with a prescribed potential. The V-PNP is constituted from the emitter layer 32 (p-type), the epitaxial layer 6 (n-type) that acts as the base layer, and the buried p+-layer 5 (p-type) that acts as the collector layer. An electrode consisting of an aluminum film 21 is connected to each of the collector-leader layer 33, the emitter layer 32, and the base-leader layer 18.

Generally, in semiconductor devices such as BiCMOS in which various elements such as bipolar transistors and MOS transistors are packaged together, a buried n+-layer 3, acting as a collector layer or lowering the resistance of the collector layer, is formed in the region to form the NPN, and a buried n+-layer 3, isolating from the substrate potential, is formed in the region to form the MOS.

In the semiconductor device shown in FIG. 1, since the buried p+-layer 5 is formed on the buried n+-layer 3, the buried p+-layer 5 acting as the collector layer can be isolated from the substrate potential by the buried n+-layer 3. Particularly in the semiconductor device of this embodiment, since the buried p+-layer 5 is formed on the buried n+-layer 3 by flotation utilizing difference in diffusion coefficients between the both buried layers, as described later, it is ensured that the buried p+-layer 5 of a high concentration is formed on the buried n+-layer 3 of a high concentration. Therefore, the collector layer (buried p+-layer 5) of the V-PNP can be isolated from the substrate potential using the buried n+-layer 3 formed in the regions of other elements such as the NPN as it is. Thereby, in the region to form the V-PNP, the formation of a buried layer different from buried layers in the regions to form the NPN or the like is not required to isolate from the substrate potential, resulting in the simplification of process steps.

Also, since the buried n+-layer 3 can be formed in common to semiconductor elements such as bipolar and MOS transistors, no mask alignment for forming the buried p+-layer 5 is required in the region to form the V-PNP. Therefore, the lowering of reliability of isolation from the substrate potential due to misalignment of the mask can be prevented.

Although FIG. 1 shows a trench structure as the structure for lateral element isolation, the buried p+-layer 5 can be formed simultaneously with a formation of the p-type isolation diffused layer (lower isolation layer), when isolation diffusion is used, or when the combination of trench isolation and isolation diffusion is used. Therefore, the buried p+-layer 5 can be formed without forming a special buried layer in the region for forming the V-PNP, and the buried p+-layer 5 acting as the collector layer can be isolated surely from the p-type silicon semiconductor substrate 1 by the buried n+-layer 3.

Next, a method of manufacturing a semiconductor device of this embodiment will be described below referring to FIGS. 2 to 4. FIGS. 2 to 4 are schematic sectional views sequentially showing the process steps of manufacturing the semiconductor device of FIG. 1. The process steps of FIGS. 2 to 4 described below are the steps of manufacturing a BiCMOS comprising a vertical pnp-bipolar transistor (V-PNP), as well as an npn-bipolar transistor (NPN), an NMOS transistor (NMOS), a PMOS transistor (PMOS), and a lateral pnp-transistor (L-PNP).

Figure 2A:
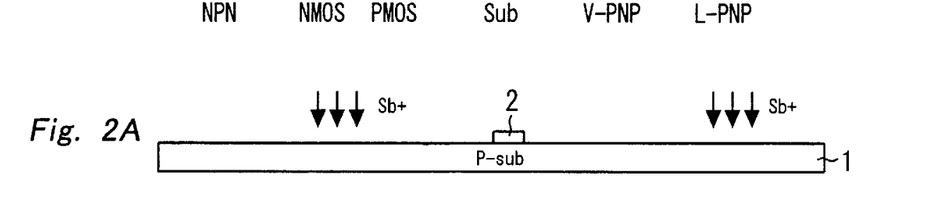
FIGS. 2A to 2E are schematic sectional views sequentially showing the process steps of manufacturing the semiconductor device of FIG. 1.

First, as shown in FIG. 2A, a silicon oxide film 2 of a prescribed pattern acting as a mask is formed on a p-type silicon semiconductor substrate 1. The region where the silicon oxide film 2 is formed becomes a substrate voltage-impressing region Sub (isolation diffused region) in subsequent steps. Thereafter, antimony (Sb) ions are implanted into the p-type silicon semiconductor substrate 1 under the condition of an acceleration energy of 30 to 50 keV, and a dose of $1 \times 10^{14}/cm^2$ to $5 \times 10^{14}/cm^2$, and the substrate 1 is subjected to heat treatment at a temperature of 1000° C. to 1200° C. for 1 to 3 hours to activate. Thereby, a buried n+-type layer 3 is formed on the p-type silicon semiconductor substrate 1. Alternatively, arsenic (As) ions may be implanted in place of antimony ions.

Figure 2B:
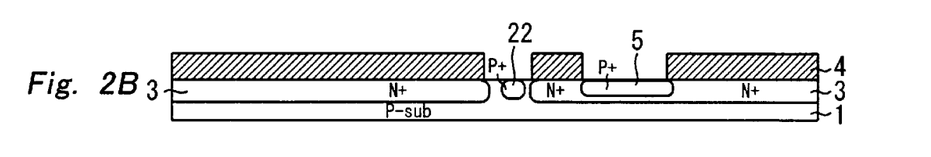

Next, as shown in FIG. 2B, a resist film 4 having openings is formed on the prescribed region by photolithography. The openings of the resist film 4 are formed in the region to impress the substrate voltage, and the region to form the V-PNP. Thereafter, boron (B) ions are implanted into the substrate 1 using the resist film 4 as a mask under the condition of acceleration energy of 20 to 40 keV, and a dose of $1 \times 10^{14}/cm^2$ to $5 \times 10^{14}/cm^2$. Thereby, a buried p+-layer 5 is formed in the region to form the V-PNP, and a p-type diffused layer 22 acting as a lower isolation layer is formed in the substrate voltage-impressing region. Similarly, a diffused layer similar to the p-type diffused layer 22 is formed in the region for isolating between semiconductor elements adjacent to each other by diffused layers, as a lower isolation layer.

Figure 2C:
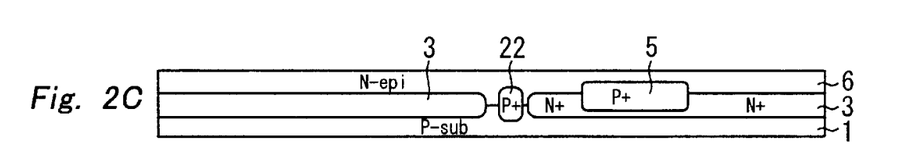

Next, as shown in FIG. 2C, epitaxial growth is performed to grow an n-type epitaxial layer 6 of a thickness of 1 to 3 μm, and a resistivity of 0.3 to 2 Ω·cm on the entire surface of the p-type silicon semiconductor substrate 1.

Figure 2D:
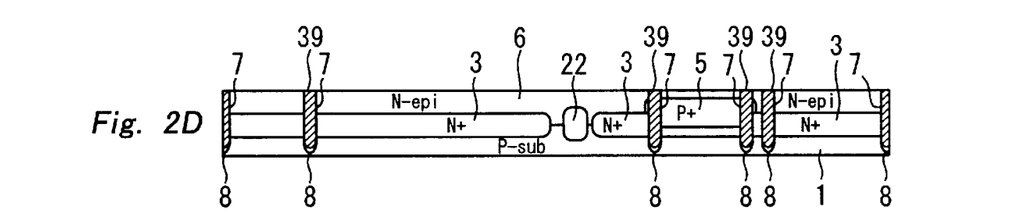

Next, a TEOS (tetraethyl orthosilicate) film (not shown) is formed, and the TEOS film is patterned to a mask pattern by photolithography followed by dry etching. Then, as FIG. 2D shows, etching is performed using the TEOS film as a mask to form trenches 7 in the boundary portions on the both sides of each region to form the NPN, the V-PNP, and the L-PNP. Thereafter, boron ions are implanted to form a surface inversion preventing layers 8 in the lower layers (bottoms) of the trenches 7, the inner wall surfaces of the trenches 7 are oxidized to form silicon oxide films 38 (not shown in FIGS. 2 to 4), and the trenches 7 are filled with polycrystalline silicon films 39. Thereby, a trench element isolation structure for electrically isolating these regions is formed.

Figure 2E:
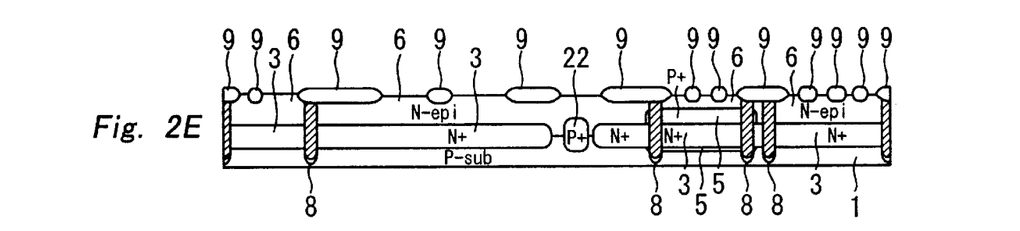

Next, as shown in FIG. 2E, field oxide film 9 is formed on the epitaxial layer 6 by the method known as LOCOS (local oxidation of silicon). More specifically, silicon nitride film is formed on the epitaxial layer 6 by a CVD method, the silicon nitride film is patterned by photolithography followed by dry etching, and the silicon nitride film is removed from the region to form the field oxide film 9. Thereafter, heat treatment is carried out at a temperature of 900° C. to 1200° C. for 30 minutes to 1 hour to thermally oxidize the surface of the epitaxial layer 6 to form the field oxide film 9.

On the other hand, by the heat treatment for forming the field oxide film 9, boron ions in the buried $P^+$-layer 5 in the region to form the V-PNP are diffused in the vertical direction. At this time, since boron, which is the impurity in the $P^+$-layer 5, has a large diffusion coefficient than antimony or arsenic, which are impurities in the buried $N^+$-layer 3, only boron ions in the buried $P^+$-layer 5 are diffused in the vertical direction, while the depth of the buried $N^+$-layer 3 is unchanged. In other words, the buried $P^+$-layer 5 floats above the buried $N^+$-layer 3, as shown in FIG. 2E. Thereby, since the p-type impurities present in the depth where the buried $N^+$-layer 3 is formed is diffused in the vertical direction, the buried $P^+$-layer 5 of a high concentration can be formed immediately above the buried $N^+$-layer 3. Therefore, the buried $P^+$-layer 5 above the buried $N^+$-layer 3 can be used as the collector layer of the V-PNP. Also in the substrate voltage-impressing region, boron ions in the p-type diffused layer 22 are diffused in the vertical direction, and boron ions in the p-type isolation diffused layer (lower isolation layer) formed by ion implantation of the same process as in the case of the buried $P^+$-layer 5 are also diffused in the vertical direction.

Figure 3A:
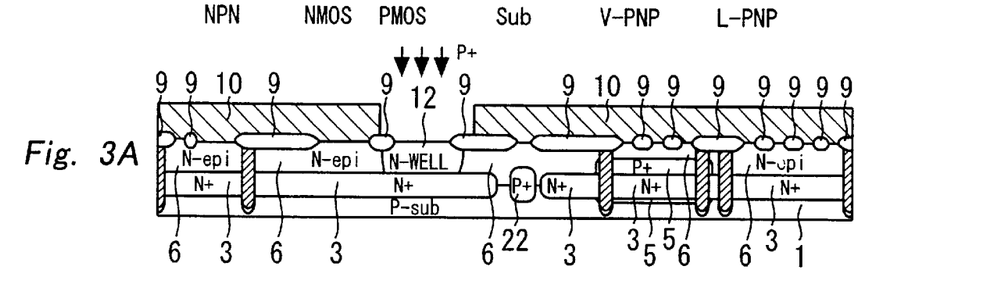
FIGS. 3A to 3D are schematic sectional views sequentially showing the process steps of manufacturing the semiconductor device of FIG. 1.

Next, as shown in FIG. 3A, a resist film 10 having an opening is formed in the region to form the PMOS by photolithography. Then, an n-well 12 is formed in the region to form the PMOS by implanting the ions of an n-type impurity using the resist film 10 as the mask.

Figure 3B:
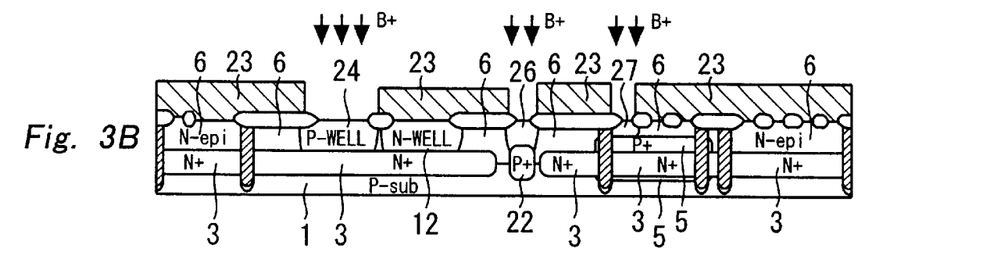

Next, as shown in FIG. 3B, a resist film 23 having openings that correspond to prescribed areas on the region to form the NMOS, the substrate voltage-impressing region, and the region to form the V-PNP is formed. Then, by using the resist film 23 as the mask, boron ions are implanted under the condition of an acceleration energy of 100 to 120 keV, and a dose of $1\times10^{14}/cm^2$ to $10\times10^{14}/cm^2$, and the substrate 1 is subjected to heat treatment at a temperature of 800° C. to 1000° C. for 30 to 60 minutes to activate. Thereby, a p-well 24, a p-type diffused layer 26 acting as an upper isolation layer, and a p-well 27 are formed in the region to form the NMOS, the substrate voltage-impressing region, and the collector drawing portion of the region to form the V-PNP, respectively. Also in the region to electrically isolate between semiconductor elements adjacent to each other by diffused layers, a diffused layer same as the p-type diffused layer 26 is formed as the upper isolation layer. The upper isolation layer (p-type diffused layer 26) is formed on the previously formed lower isolation layer (p-type diffused layer 22), and functions as an integrated p-type isolation diffused layer.

Figure 3C:
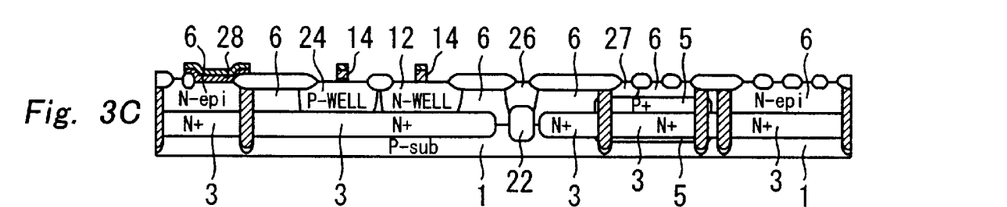

Next, as shown in FIG. 3C, gate electrode 14 is formed through gate oxide film on the region to form the NMOS and the region to form the PMOS. An electrode 28 to be connected to the external base is formed so as to cover the prescribed area of the region to form the NPN.

Figure 3D:
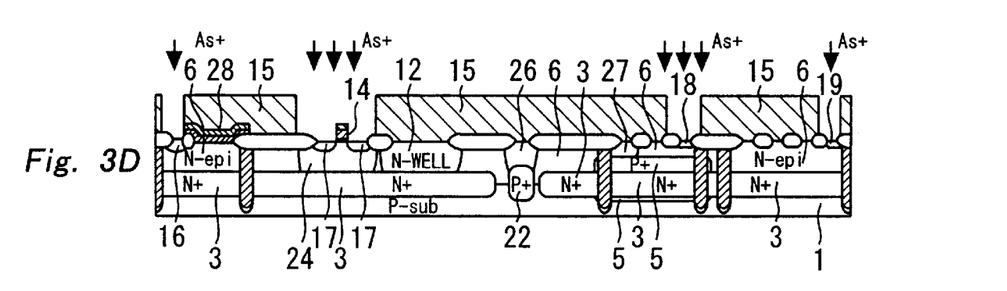

Next, as shown in FIG. 3D, a resist film 15 having openings that correspond to prescribed areas on the region to form the NPN, the region to form the NMOS, the region to form the V-PNP, and the region to form the L-PNP is formed. Then, using the resist film 15 as the mask, arsenic (As) ions are implanted under the condition of an acceleration energy of 20 to 50 keV, and a dose of $3\times10^{14}/cm^2$ to $5\times10^{15}/cm^2$, and the substrate 1 is subjected to heat treatment at a temperature of 800° C. to 900° C. for 30 to 60 minutes to activate. Thereby, a collector layer 16 of the NPN, source-drain diffused layers 17 of the NMOS, a base leader layer 18 of the V-PNP, and a base leader layer 19 of the L-PNP are formed.

Figure 4A:
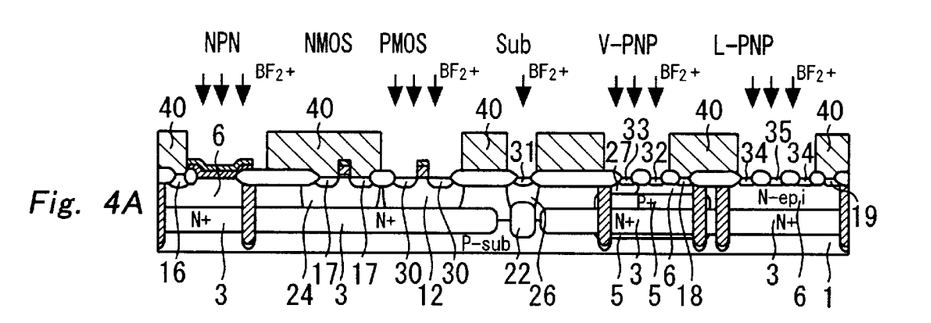
FIGS. 4A to 4D are schematic sectional views sequentially showing the process steps of manufacturing the semiconductor device of FIG. 1.

Next, as shown in FIG. 4A, a resist film 40 having openings that correspond to prescribed areas on the region to form the NPN, the region to form the PMOS, the substrate voltage-impressing region, the region to form the V-PNP, and the region to form the L-PNP is formed. Then, boron ions or boron fluoride ($BF_2$) are implanted under the condition of an acceleration energy of 10 to 50 keV, and a dose of $3\times10^{14}/cm^2$ to $5\times10^{15}/cm^2$, to lower the resistance of the electrode 28 to be connected to the external base of NPN region. Also, a p-type source-drain diffused layer 30 is formed in the region to form the PMOS; a p-type diffused layer 31 is formed in the substrate voltage-impressing region; an emitter layer 32 and a collector leader layer 33 are formed in the region to form the V-PNP; and an emitter layer 34 and a collector layer 35 are formed in the region to form the L-PNP.

Figure 4B:
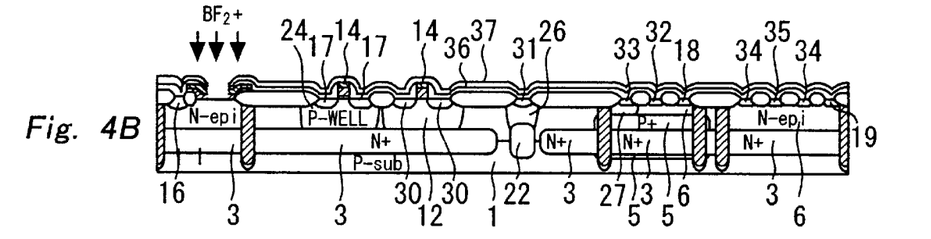

Next, as shown in FIG. 4B, a silicon oxide film 36 and a silicon oxide film 37 are sequentially formed on the entire surface of the p-type silicon semiconductor substrate 1, and an opening for the base region is formed in the region to form the NPN by photolithography followed by dry etching. Thereafter, by using the silicon oxide films 36 and 37 as the masks, boron fluoride is implanted to form a base layer 41 in the region to form the NPN.

Figure 4C:
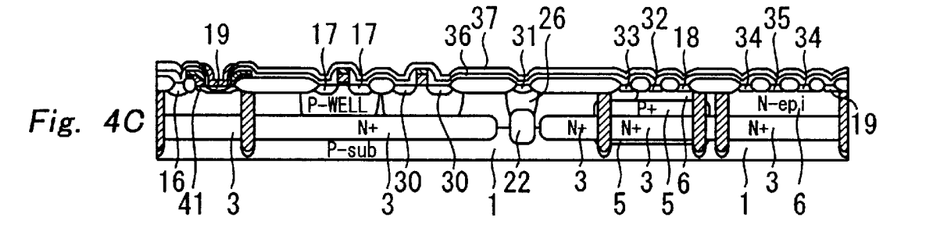

Next, as shown in FIG. 4C, a side wall is formed in the base region, and a polysilicon layer of a thickness of 1500 to 2000 angstrom acting as an emitter-drawing electrode is formed. Next arsenic (As) is implanted into the entire surface under the condition of an acceleration energy of 40 keV, and a dose of $5\times10^{15}/cm^2$ to $1.6\times10^{16}/cm^2$ (5E15 to 1.6E16/$cm^2$), and the polysilicon layer is patterned and the substrate 1 is subjected to heat treatment to form an emitter layer 42.

Figure 4D:
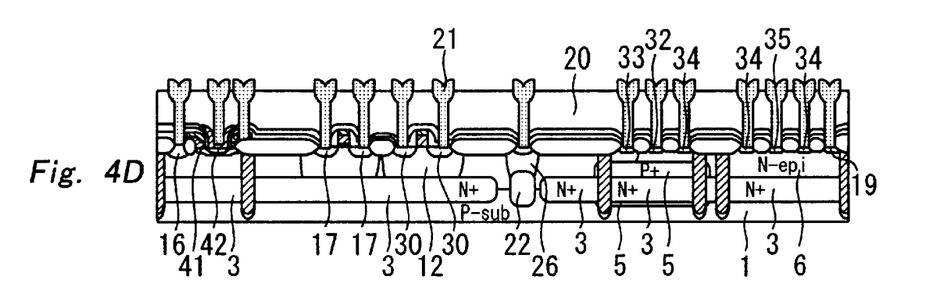

Next, an interlayer insulating film 20 is formed on the entire surface, and a contact hole is formed in the interlayer insulating film 20 by photolithography followed by dry etching. Thereafter, an aluminum film 21 is formed by sputtering, and is patterned into a prescribed pattern by photolithography followed by dry etching. Thereby, a semiconductor device comprising NPN, NMOS, PMOS, V-PNP, and L-PNP, as shown in FIG. 4D, is formed.

In the above-described process, since boron, which has a larger diffusion coefficient than the diffusion coefficient of antimony, which is the impurity in the buried $N^+$-layer 3, is implanted as the impurity in the buried $P^+$-layer 5, the buried $P^+$-layer 3 can be formed above the buried $N^+$-layer 3 by the ion implantation of antimony and boron followed by heat treatment, due to difference in diffusion coefficients.

Figure 5A:
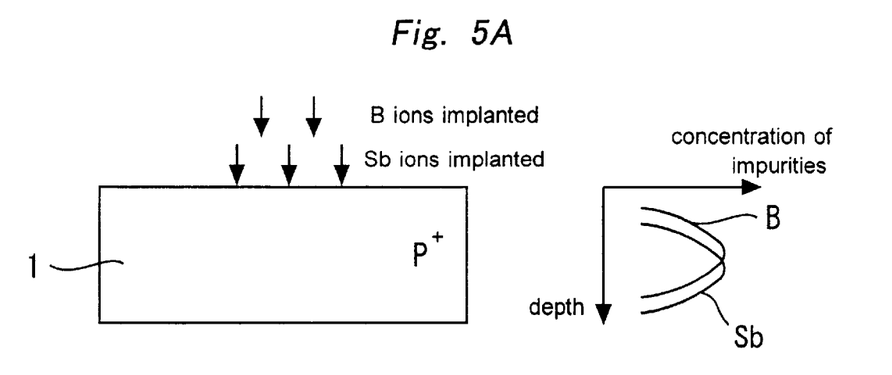
FIGS. 5A and 5B are schematic diagrams showing the laminated state of each layer on the p-type silicon semiconductor substrate 1 when the buried P⁺-layer 5 is formed, and the concentration of impurities at various depths from the topmost surface.
Figure 5B:
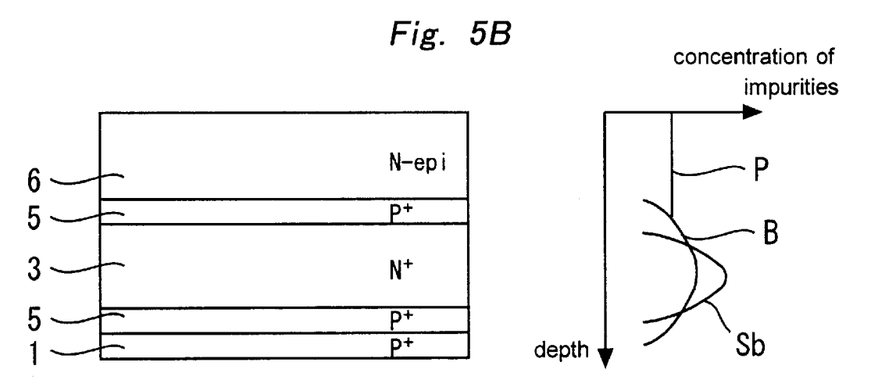

FIG. 5 is a schematic diagram showing the laminated state of each layer on the p-type silicon semiconductor substrate 1 when the buried $P^+$-layer 5 is formed, and the concentration of impurities at various depths from the topmost surface. Here, FIG. 5A shows the state where antimony (Sb) ions and boron (B) ions are implanted into a p-type silicon semiconductor substrate 1 in the steps of FIG. 2A and FIG. 2B. FIG. 5B shows the state where a field oxide film 9 has been formed and subjected to heat treatment by the step of FIG. 2E, after the growth of the epitaxial layer 6 by the step of FIG. 2D.

As shown in FIG. 5A, immediately after antimony ions and boron ions are implanted under the conditions of FIG.

2A and FIG. 2B, the concentration peaks of antimony and boron in the depth direction are present at substantially the same depth.

After the epitaxial layer 6 has been formed and subjected to heat treatment, as FIG. 5B shows, antimony, which has a smaller diffusion coefficient, is not diffused significantly in the depth direction, and forms the buried N$^+$-layer 3 in the vicinity of the depth where the ions are initially implanted. On the other hand, boron, which has a larger diffusion coefficient than that of antimony, is diffused vertically, and forms buried P$^+$-layers 3 on and under the buried N$^+$-layer 3. Thereby, the buried P$^+$-layer 5 adhering to the buried N$^+$-layer 3 can be formed on the buried N$^+$-layer 3.

According to this embodiment, as described above, since impurities that has a larger diffusion coefficient than the diffusion coefficient of the impurity in the buried N$^+$-layer 3 is used as the p-type impurity for the buried P$^+$-layer 5, the buried P$^+$-layer 5 can be surely formed on the buried N$^+$-layer 3 by thermally diffusing the impurities of the buried P$^+$-layer 5 after the buried N$^+$-layer 3 of a high concentration is formed in common in the regions to form various transistors. Thereby, the collector layer can be isolated from the substrate potential without forming a specific buried layer, for example, a special buried n-layer, in the region to form the vertical bipolar transistor. Therefore, a semiconductor device, such as BiCMOS, comprising various elements, such as an npn-bipolar transistor and a MOS transistor, can be manufactured in a simple process.

Also, since the buried P$^+$-layer 5 can be formed on the buried N$^+$-layer 3 after the buried N$^+$-layer 3 is formed evenly in the regions where these various element have been formed, without special mask alignment, the region to form the vertical pnp-bipolar transistor can be prevented from expanding due to mask alignment, and further downsizing of the device can be achieved.

In addition, a lower isolation layer (p-type diffused layer 22) of the isolation diffused layer for isolating between the regions to form various transistors can be formed together with the buried P$^+$-layer 5. Thereby, the number of process steps can be reduced particularly for manufacturing a bipolar integrated circuit to isolate elements by isolation diffusion, resulting in the reduction of the manufacturing costs. Also by combining trench isolation, improvement of the reliability of element isolation can further be achieved.

Constituted as described above, the present invention exerts effects as shown below.

In a semiconductor device comprising a vertical pnp-bipolar transistor in a prescribed element region, by forming a p-type collector layer so as to adhere onto an n-type buried layer of a high concentration, the n-type buried layer can isolate the collector layer from the substrate potential. Also, by forming the p-type collector layer on the n-type buried layer, the p-type collector layer can be formed without special mask alignment, and the further downsizing of the device can be achieved.

Since the diffusion coefficient of the impurity in the collector layer is selected to be larger than the diffusion coefficient of the impurity in the n-type buried layer, the impurities in the collector layer can be diffused on the n-type buried layer by heat treatment after the impurities are implanted in the n-type buried layer and the collector layer. Thereby, the p-type collector layer can be surely formed on the n-type buried layer.

The n-type buried layer formed in common in element regions other than the region to form the pnp-bipolar transistor can be used as the collector layer of the npn-bipolar transistor, or for isolation from the substrate potential. Therefore, in a semiconductor device comprising a pnp-bipolar transistor and other elements such as an npn-bipolar transistor, the manufacturing process can be simplified, and the manufacturing costs can be reduced.

By providing an isolation diffused layer for electrically isolating element regions, and forming a collector layer as the same layer at least as the lower portion of the isolation diffused layer, the collector layer can be formed at the same time as the formation of the isolation diffused layer. Thereby, the manufacturing process can be simplified, and the manufacturing costs can be reduced.

By further providing trench element isolation for electrically isolating element regions, isolation between element regions can be ensured, and the reliability of the device can be improved.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-200423, filed on Jul. 2, 2001 including specification, claims, drawings and summary, on which the Convention priority of the present application is based, are incorporated herein by reference in its entirety.

What is claimed is:

1. A semiconductor device, comprising:
   a semiconductor substrate;
   an n-type buried layer of high concentration formed on said semiconductor substrate;
   a p-type diffused layer formed following said n-type buried layer on said n-type buried layer;
   an n-type epitaxial layer on said p-type diffused layer; and
   a pnp-bipolar transistor having said p-type diffused layer as a collector layer and said n-type epitaxial layer as a base layer, formed on said semiconductor substrate.

2. The semiconductor device according to claim 1, wherein a diffusion coefficient of an impurity in said p-type diffused layer is larger than the diffusion coefficient of the impurity in said n-type buried layer.

3. The semiconductor device according to claim 1, further comprising an npn-bipolar transistor formed on said n-type buried layer on said semiconductor substrate.

4. The semiconductor device according to claim 1, further comprising an isolation diffused layer for electrically isolating a plurality of element regions on said semiconductor substrate,
   wherein said p-type diffused layer is formed as the same layer as a lower portion of said isolation diffused layer.

5. The semiconductor device according to claim 1, further comprising a trench element isolation for electrically isolating a plurality of element regions on said semiconductor substrate.

6. The semiconductor device according to claim 2, further comprising an npn-bipolar transistor formed on said n-type buried layer on said semiconductor substrate.

7. The semiconductor device according to claim 2, further comprising an isolation diffused layer for electrically isolating a plurality of element regions on said semiconductor substrate,
   wherein said p-type diffused layer is formed as the same layer as a lower portion of said isolation diffused layer.

8. The semiconductor device according to claim 2, further comprising a trench element isolation for electrically isolating a plurality of element regions on said semiconductor substrate.

* * * * *